(12) United States Patent
Chen

(10) Patent No.: US 9,318,442 B1
(45) Date of Patent: Apr. 19, 2016

(54) INTEGRATED FAN-OUT PACKAGE WITH DUMMY VIAS

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/500,599

(22) Filed: Sep. 29, 2014

(51) Int. Cl.
  *H01L 23/48*  (2006.01)
  *H01L 23/538*  (2006.01)
  *H01L 21/56*  (2006.01)
  *H01L 21/48*  (2006.01)

(52) U.S. Cl.
  CPC .......... *H01L 23/5389* (2013.01); *H01L 21/486* (2013.01); *H01L 21/4857* (2013.01); *H01L 21/563* (2013.01); *H01L 23/5384* (2013.01)

(58) Field of Classification Search
  USPC ......................................................... 257/695
  See application file for complete search history.

(56) References Cited

U.S. PATENT DOCUMENTS

2009/0309212 A1* 12/2009 Shim et al. .................... 257/700
2014/0110856 A1* 4/2014 Lin ............................... 257/774

\* cited by examiner

*Primary Examiner* — Daniel Whalen
(74) *Attorney, Agent, or Firm* — Slater & Matsil, L.L.P.

(57) ABSTRACT

Disclosed herein is a device comprising a first redistribution layer (RDL) having first lands disposed on a bottom surface of the first RDL and active contact pads disposed on a top surface of the first RDL. The first RDL electrically connects the first lands to the active contact pads. A molding compound layer is disposed on the top surface of the first RDL. Active vias extend through the molding compound layer and are in electrical contact with the active contact pads. Dummy vias extending through the molding compound layer. Top surfaces of the active vias and top surfaces of the dummy vias are substantially planar with a top surface of the molding compound layer, and the dummy vias are electrically insulated from the active vias and the first lands.

20 Claims, 12 Drawing Sheets

INTEGRATED FAN-OUT PACKAGE WITH DUMMY VIAS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In some devices, multiple dies or packages with active devices or circuits are stacked vertically to reduce the footprint of a device package and permit dies with different processing technologies to be interconnected. Interconnections for this vertical stacking are created on the top and bottom surfaces of a substrate by forming redistribution layers (RDLs) with conductive lines in insulating layers. The RDLs and the dies external to a particular package are electrically connected to dies in the substrate, or dies on opposing sides of the substrate by vias extending through the substrate. Additionally, studs extend through the substrate to a die within the substrate and provide electrical connectivity between the die and external devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
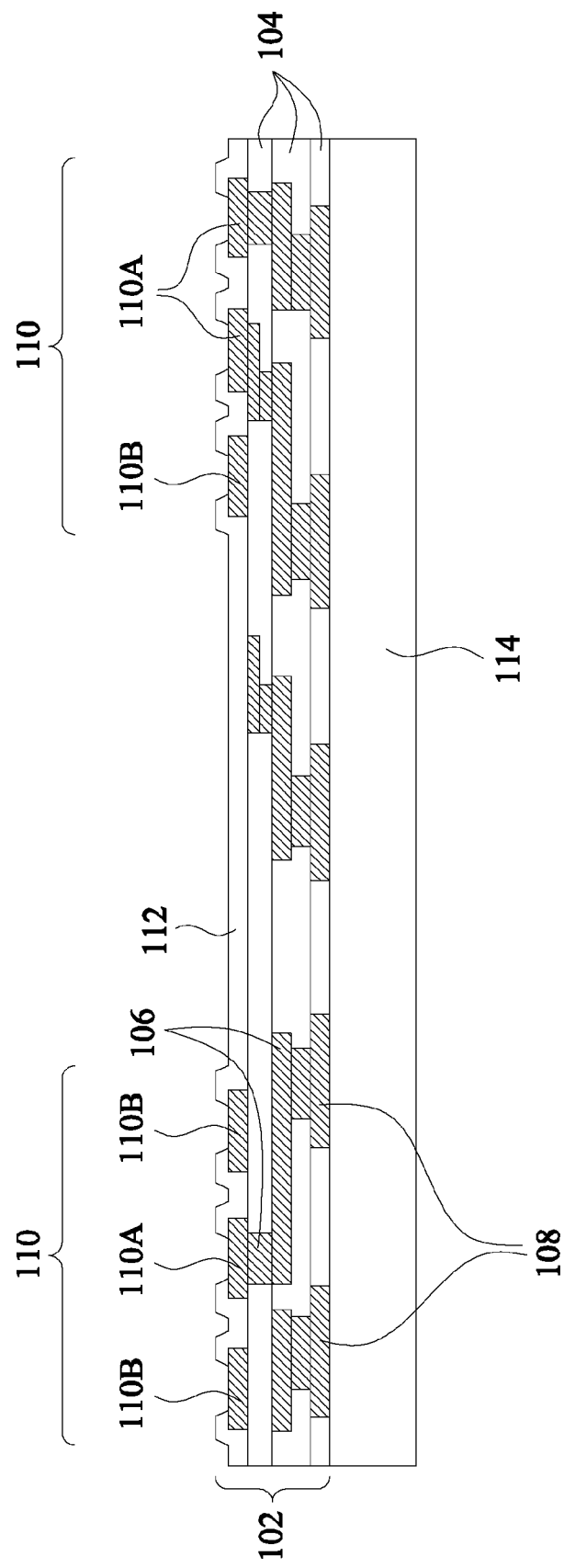
FIGS. 1 through 8 illustrate cross-sectional views of intermediate steps in forming a package with dummy through vias in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three dimensional integrated circuit (3D IC) packages are formed by stacking one or more devices or dies vertically. These devices are attached by way of connectors such as, for example, a ball grid array (BGA), a land grid arrays (LGA), solder balls, studs, wire bonds, or other conductive connectors. Conductive elements are disposed in redistribution layers (RDLs) on both sides of the package to provide connectivity between the connectors and the package. The connectors are disposed on each side of a package to permit connection to adjoining packages on top and bottom of the package. Conductive vias are disposed in an electrically insulating substrate and extend through the substrate between the RDLs to provide electrical connectivity between RDLs on opposing sides of the package. Additionally, dies are disposed within the package between the RDLs, with conductive studs electrically connecting contact pads in the die to the RDLs.

Disclosed herein is a method for forming dummy vias and studs in the substrate. The dummy vias are used to provide a uniform metal distribution within the substrate and increase the density of metal elements so that grinding of the substrate does not dish or over grind areas with lower densities of metal features. The dummy vias provide a system for increasing and homogenizing the density of metal features in the substrate, preventing irregularities in the ground substrate surface. Thus, subsequent layers, such as RDL layers, are formed on a uniform and planar surface.

FIG. 1 is a cross-sectional view illustrating a step in forming a first RDL 102 according to some embodiments. In some embodiments, the first RDL 102 is formed on a carrier 114 such as a glass or insulating carrier, wafer or other supporting structure. The first RDL 102 comprises one or more dielectric layers 104 that are, for example, an oxide such as silicon dioxide, a nitride such as silicon nitride, a carbide such as silicon carbide, polybenzoxazole (PBO), a polymer, a polyimide or another dielectric material. The first RDL 102 also comprises lands 108 disposed on the bottom surface of the first RDL 102 and conductive elements 106 disposed in the dielectric layers 104. The conductive elements 106 are formed though, for example, deposition and patterning of the conductive elements 106. The conductive elements 106 are formed from a conductive material such as copper (Cu) aluminum (Al), aluminum-copper alloy (AlCu), tungsten (W), gold (Au) or another conductive material or alloy. The lands 108 are formed by, for example, a physical vapor deposition (PVD) process such as sputtering or the like, or by electroplating, electroless plating or another process. The conductive elements 106 extend through the dielectric layers 104 to provide electrical connections between contact pads 110 and lands 108.

Contact pads 110 are formed at the top surface of the first RDL 102. In some embodiments, the contact pads 110 are formed of copper, aluminum, or another metal by way of PVD or another deposition process. In some embodiments, some contact pads 110 are active contact pads 110A that are disposed on, and electrically connected to, the conductive elements 106. The active contact pads 110A are electrically connected to lands 108 by way of the conductive elements 106. Additionally, in some embodiments, one or more contact pads 110 are dummy contact pads 110B that are electrically insulated from other contact pads 110 and from the lands 108. Dummy contact pads 110B provide a mounting point for subsequent formation of dummy vias.

While the contact pads 110 are illustrated as being formed directly on the top surface of the topmost dielectric layer 104, the structure is not limited to such an embodiment. In other embodiments, the contacts pads 110 are post passivation interconnects (PPIs), and are formed over a passivation layer (not shown) on the top surface of the first RDL 102. In such embodiments, the passivation layer is formed from a nitride such as silicon nitride (SiN), silicon oxynitride (SiON) or another material. Additionally, in some embodiments, a protection layer 112 is formed over the topmost dielectric layer 104 and has openings exposing the contact pads 110. In such embodiments, the protection layer 112 is PBO, a polyimide, an oxide, nitride or oxynitride, or another material.

One or more lands 108 are formed from a conductive material The metal used to form the lands 108 is patterned to provide individual lands 108 that are each configured to accept a subsequently formed connector for mounting the package to an external device, die, package, wafer or the like. Additionally, while the lands 108 are shown as being formed on the bottom surface of the bottommost dielectric layer 104, the lands 108 are not limited to such embodiments. In other embodiments, the lands 108 are embedded in the lowermost dielectric layer 104, or are formed over a passivation layer on the bottommost dielectric layer 104 as a PPI. Additionally, in some embodiments, a protective layer or the like is formed on the lands 108, and has openings over the lands 108 to permit the mounting of a connector such as a solder ball, stud or the like for connection to an external device.

Figure 2:
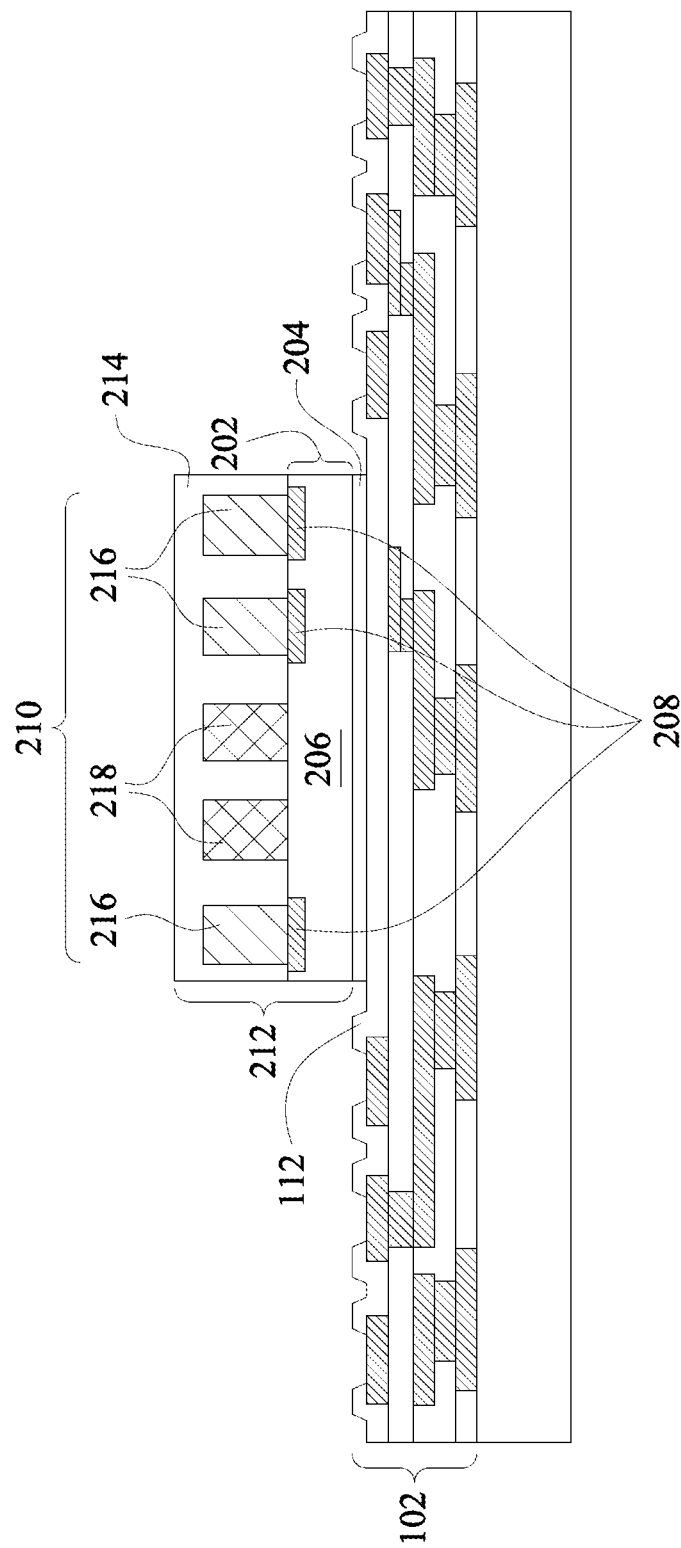

FIG. 2 is a cross-sectional view illustrating mounting a structure 212 according to some embodiments. The structure 212 has a substrate 202 and is mounted by attaching the substrate 202 to, for example, the protection layer 112, where used, or the back side of the first RDL 102. In some embodiments, the substrate 202 is a die, chip, package or the like, and has one or more transistors or devices such as MOSFETs, FinFETs, capacitors, or another substrate, or has a circuit comprising one or more substrates or another circuit element. The substrate 202 is attached to the protection layer 112 using a die attachment film 204, adhesive, heat transfer film, or the like.

The substrate 202 has one or more contact pads 208 exposed at the surface of a device body 206. In some embodiments, the contact pads 208 are arranged in a regular pattern with one or more dummy contact pads. In other embodiments, the contact pads 208 are arranged in an irregular pattern with spaces or open portions between the contact pads 208.

In some embodiments, the structure 212 comprises one or more studs 210 disposed on the substrate 202 with a molding compound layer 214 formed around the studs 210. For clarity, active studs 216 and dummy studs 218 are referred to collectively as studs 210. Conductive studs 210 are formed over the substrate 202, with active studs 216 disposed on contact pads 208 to provide electrical connectivity between the substrate 202 and subsequently formed layers. Dummy studs 218 are formed in subsequent steps on the surface of the substrate 202 between the contact pads 208 to raise the density of metal features. In some embodiments, the substrate 202 has dummy contact pads (not shown) and the dummy studs 218 are formed on the dummy contact pads with the dummy contact pads providing increased support and adhesion for the dummy studs 218. The molding compound layer 214 fills gaps between the studs 210 and in some embodiments, is an epoxy, resin, PBO, polyimide, oxide, nitride or another electrically insulating material. In some embodiments, the molding compound layer 214 is formed on a wafer having multiple substrates prior to singulation of the wafer into individuals dies or substrates.

In some embodiments, the studs 210 are formed by applying the molding compound layer 214 over the surface of the substrate 202, and then patterning the molding compound layer 214 before plating, or otherwise depositing, a conductive material in the openings to form the studs 210. In some embodiments, the studs 210 are formed by patterning a mask, plating openings in the mask with a metal or otherwise depositing a conductive material in the openings, and removing the mask to leave the studs 210. In such an embodiment, the molding compound layer 214 is formed around the studs 210 after the studs 210 are formed. In other embodiments, the studs 210 are formed using a wirebonder, creating the studs 210 from a wire that is wirebonded upright on a contact pad 208 and subsequent formation of the molding compound layer 214. In yet other embodiments, the studs 210 are formed through placement of a pre-formed rigid structure, or another formation process.

Figure 3:
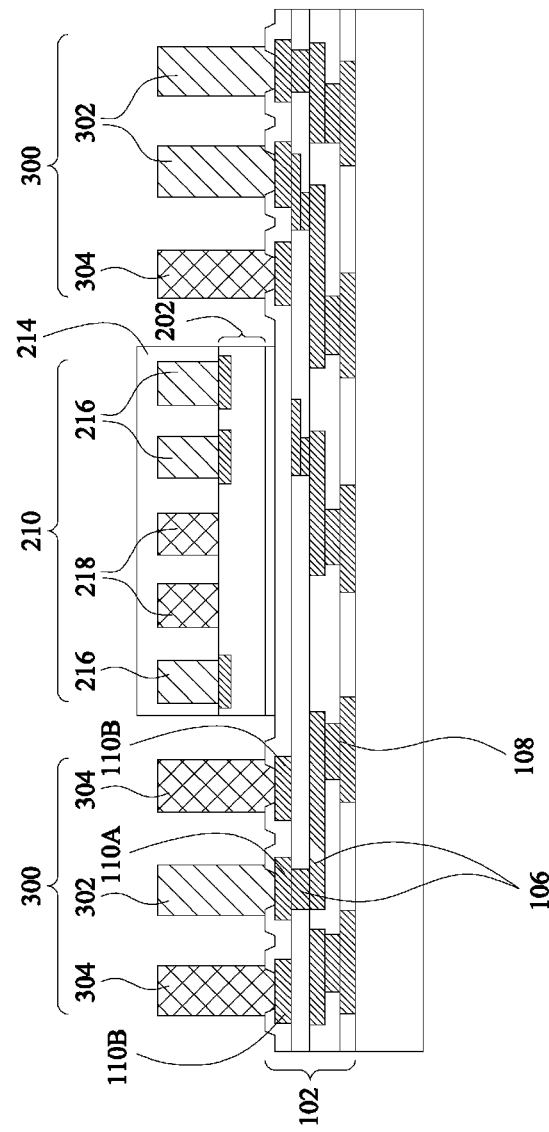

FIG. 3 is a cross-sectional view illustrating formation of vias 300 according to some embodiments. For clarity, active vias 302 and dummy vias 304 are referred collectively as vias 300. In some embodiments, one or more vias 300 are formed on the first RDL 102 in regions adjacent to the substrate 202. Active vias 302 are formed on active contact pads 110A and are electrically connected to the conductive elements 106 in the first RDL 102 through the active contact pads 110A. In some embodiments, dummy vias 304 are formed on dummy contact pads 110B, where used. In other embodiments, the dummy vias 304 are formed on the protective layer 112 or directly on the first RDL 102.

Conductive studs 210 are formed over the substrate 202. The vias 300 are formed around the structure 212 using a process similar to those described above with respect to the formation of the studs 210. For example, the vias 300 are formed by patterning a mask and plating openings in the mask, using a wirebonder, through placement of a pre-formed rigid structure, or another formation process. While the structure 212 is illustrated as having the studs formed on the substrate 202 when the structure is mounted, the process for forming the structure 212 and vias 300 is not limited to such an embodiment. In other embodiments, the structure 212 is mounted without studs 210 and the studs 210 are formed in a same procedure as the vias 300.

Figure 4:
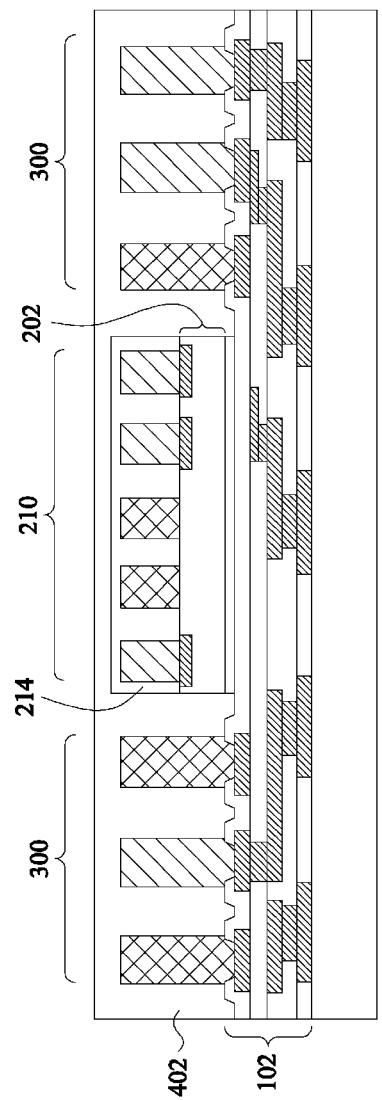

FIG. 4 is a cross-sectional view illustrating formation of a molding compound layer 402 according to some embodiments. The molding compound layer 402 is formed around the substrate 202, around the vias 300 and the molding compound layer 214. In some embodiments, the molding compound layer 402 extends over the molding compound layer 214. The molding compound layer 402 fills gaps between the vias 300, and fills the gaps between the substrate 202 or molding compound layer 214 and the vias 300. In some embodiments, the molding compound layer 402 extends over the topmost surfaces of the vias 300.

In some embodiments, the molding compound layer 402 is formed from an epoxy, resin, PBO, polyimide, oxide, nitride or another electrically insulating material. In embodiments where the molding compound is formed from a flowable material such as a gel or liquid, a mold, molding chase or form is used to retain the molding compound during application and subsequent curing.

Figure 5:
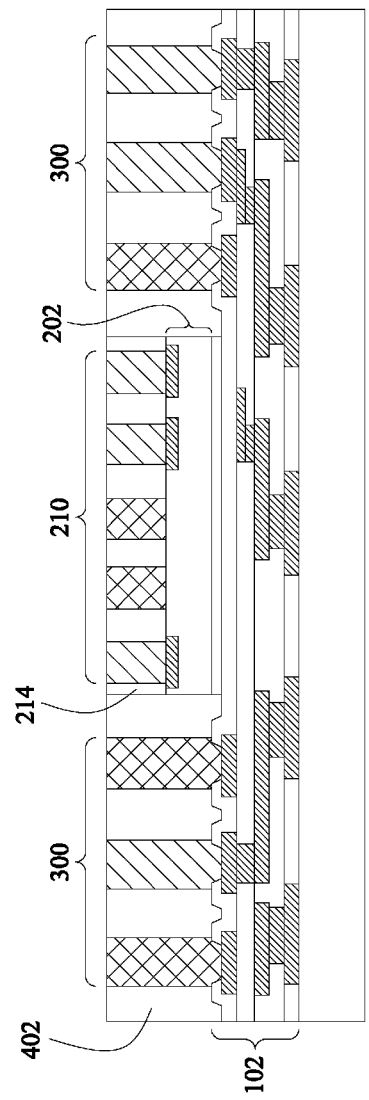

FIG. 5 is a cross-sectional view illustrating reduction of the molding compound layers 402 and 214 according to some embodiments. In some embodiments, the molding compound layers 402 and 214 are reduced by planarizing the top surfaces of the molding compound layers 402 and 214, by, for example, grinding, a chemical-mechanical polish (CMP), etch, or the like. The resulting top surface of the molding compound layers 402 and 214 is then substantially coplanar with the vias 300 and studs 210. After reducing the molding compound layer 402, the vias 300 extend through the molding compound layer 402 from the first RDL 102 to the top surface of molding compound layer 402, and the studs 210 extend through the molding compound layer 214 from the top surface of the substrate 202 to the top surface of the molding compound layer 214. The vias 300 and studs 210 extending through the molding compound layer 402 and 214 permit electrical connection of the first RDL 102 and the substrate 202 to subsequently formed features such as a second RDL (See FIG. 6).

The metal material of the vias 300 and studs 210 tends to be harder than the material of the molding compound layers 402 and 214, resulting in a lower removal rate during a grinding, CMP, polishing or other reduction processes. A polishing head used to perform the reduction of the molding compound layers 402 and 214 will, in some instances, cause dishing of softer material. Thus, in molding compound layers 402 and 214 where the vias 300 and studs 210 have an irregular pattern, the molding compound material, and in some cases, the metal features, will be reduced at a greater rate, resulting in an uneven surface. It has been discovered that having dummy vias 304 and dummy studs 218 extending through the molding compound layers 402 and 214 during grinding increases the uniformity of the surface of the molding compound layer 402 after grinding. The increased metal density and more regular distribution of metal features in the molding compound layers 402 and 214 provided by the dummy vias 304 prevents the polishing head from removing excess material in regions of lower metal density. In some embodiments, active vias 302 are arranged in an irregular pattern, with the active vias 302 having spaces in the via pattern. In such embodiments, dummy vias 304 are formed in such spaces, raising the density of metal features at the surface of the molding compound layer 402 during grinding. For example, grinding a molding compound layer 402 without dummy vias 304 and with irregular spacing of the active vias 302 can result in a surface topography variation around 5 µm. However, providing dummy vias 304 to raise the metal density results in a surface topography variation of 2 µm or less.

Similarly, dummy studs 218 are formed in the spaces of an irregular pattern for the active studs 216. Additionally, in some embodiments, the vias 300 are formed in an integrated fan-out (InFO) arrangement; with the vias 300 arranged around and outside of the substrate 202 and studs 210. In such an embodiment, dummy vias 304 are disposed between the active vias 302 and the studs 210 to increase the metal density between the active vias 302 and the studs 210.

It has been further discovered that raising the global density of the metal features in one or both molding compound layers 402 and 214 across the surface of a die to between about 40% and about 60% results in a substantially planar molding compound surface after reducing the molding compound layers 402 or 214.

Additionally, raising the local density of the metal features in the molding compound layers 402 and 214 in regions with active vias 302 and active studs 216 to between about 15% and about 60% results in a substantially planar surface in the local region. For example, in a die with an area of 5 mm×5 mm the global density of vias 300 and studs 210 is about 40% to about 60% of the surface area of the die, while 125 µm×125 µm local regions on the surface of the die have a density of vias 300 and studs 210 between about 15% and about 60%, with the global density of metal vias 300 and studs 210 depending on the density of features in the local regions.

Figure 6:
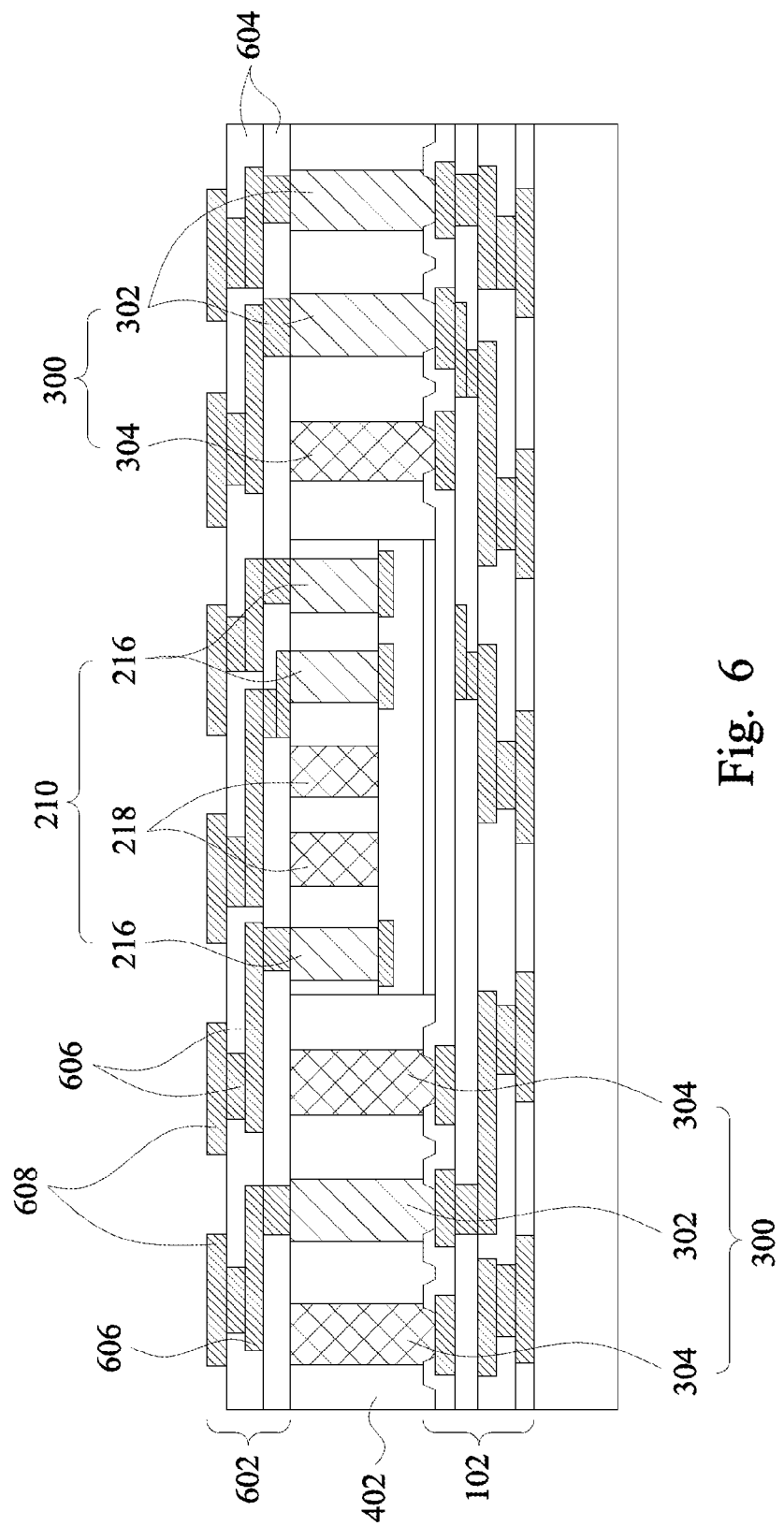

FIG. 6 is a cross-sectional view illustrating for mounting a second RDL 602 to form the package 600 according to some embodiments. In some embodiments, the second RDL 602 is formed using a process similar to that described above with respect to the first RDL 102. The bottom surface of the second RDL 602 is substantially planar, matching the topography of the top surfaces of the molding compound layers 402 and 214. The second RDL 602 has one or more dielectric layer 604 with conductive features 606 disposed therein. The conductive features 606 extend through the dielectric layers 604 to connect the active vias 302 to lands 608 disposed on the top surface of the second RDL 602. In some embodiments, the dielectric layers 604 cover the topmost surfaces of the dummy vias 304 and the dummy studs 218, electrically insulating the dummy vias 304 from the lands 608. While the conductive features 606 are illustrated herein as being separated from, and not contacting, the dummy vias 304 and dummy studs 218, in some embodiments, or more conductive features 606 are formed on, or in electrical contact with, the dummy vias 304 or dummy studs 218, but are electrically isolated from, or not electrically connected to the lands 608. Thus, the dummy vias 304 and dummy studs 218 are electrically insulated from external devices.

Figure 7:
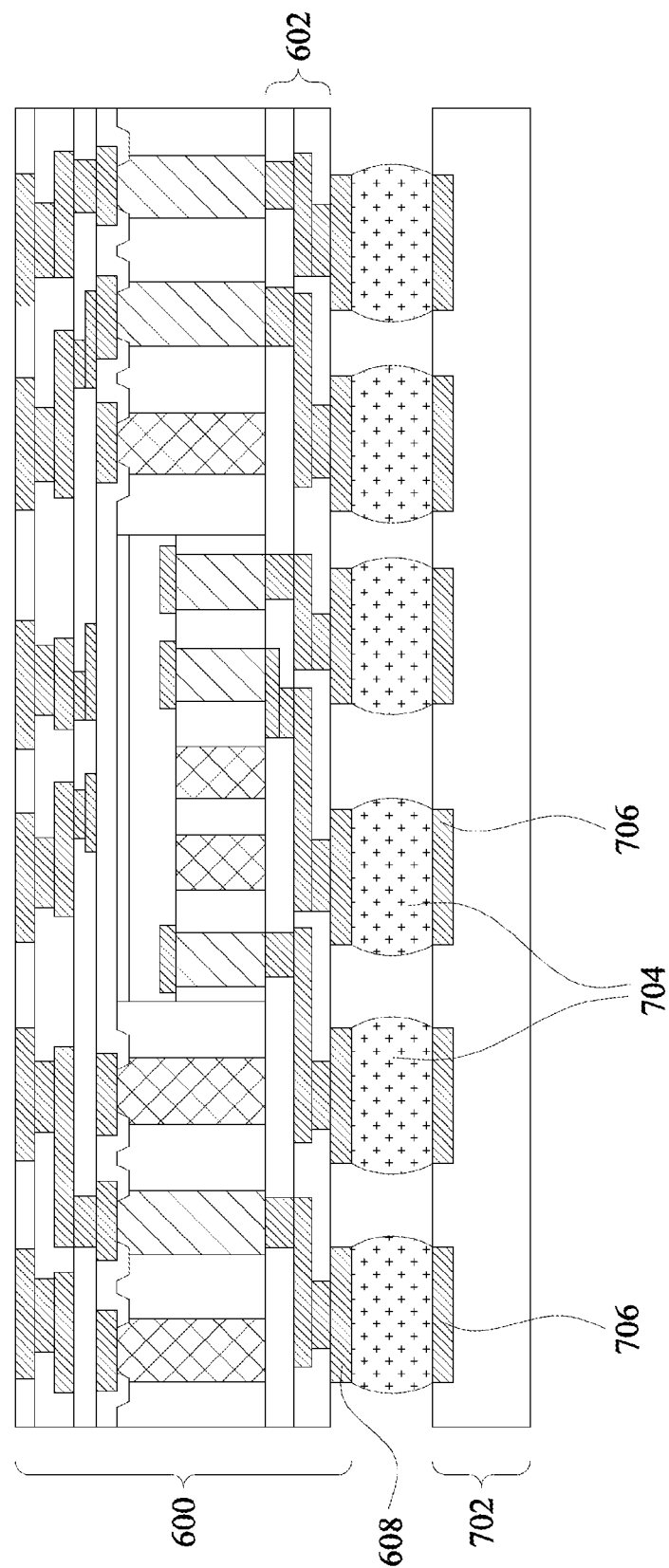

FIG. 7 is a cross-sectional view illustrating mounting the package 600 on a second substrate 702 according to some embodiments. In some embodiments, package 600 is inverted and mounted to a second substrate 702 such as a PCB, package, die, interposer, carrier or other structures. The connectors 704 are formed on lands 706 on the second substrate 702, with the package 600 attached to the connectors 704 at the lands 608. In other embodiments, the connectors 704 are formed on the lands 608 prior to joining the package 600 to the second substrate 702. One or more connectors 704 are used to electrically connect the package 600 to the second substrate 702. The connectors 704 are, for example, solder balls, conductive bumps, pillars, studs or another conductive structure. In an embodiment where the connectors 704 are solder balls, the package 600 is mounted on the second substrate 702 and then the solder ball connectors 704 are heated to reflow the solder, providing a rigid electrical connection between the lands 608 of the package 600 and the lands 706 of the second substrate 702.

Figure 8:
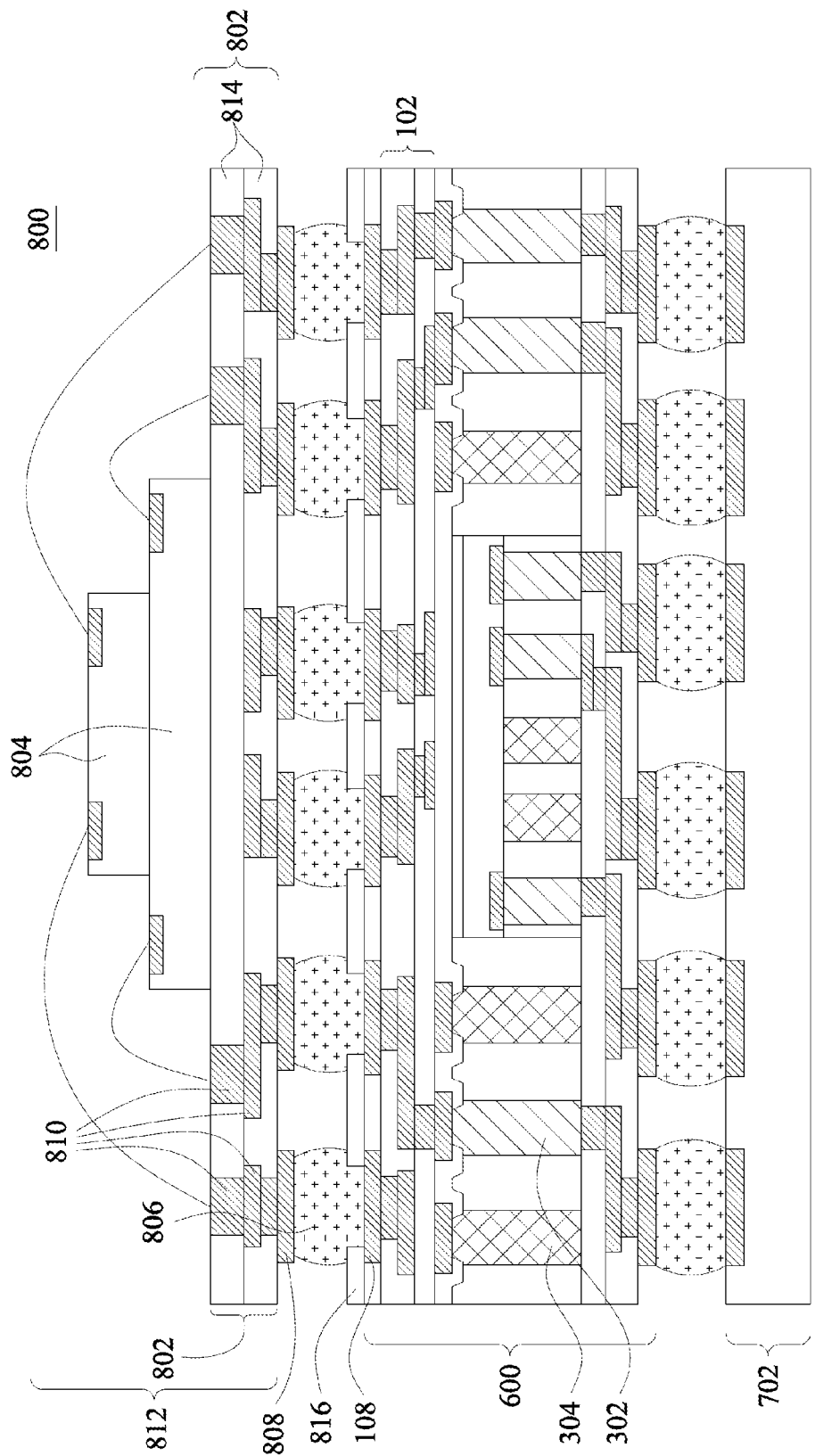

FIG. 8 is a cross-sectional view illustrating mounting of a third substrate 812 on the top of the package 600 to form a device 800. In some embodiments, a protective layer 816 is formed over the first RDL 120 with openings exposing the lands 108, and the third substrate 812 is mounted on the first RDL 102. Additionally, in some embodiments, the third substrate 812 comprises an interposer 802, RDL, or other mounting surface, with one or more dies 804 disposed thereon. The dies 804 are in electrical communication with lands 808 disposed on the bottom of the interposer 802 by way of conductive elements 810 disposed in one or more insulating or dielectric layers 814. The third substrate 812 is mounted to the package 600 by connectors 806 that are, in some embodiments, solder balls, conductive bumps, pillars, studs, or another conductive structure.

While the third substrate 812 is shown as being mounted on the package 600 after the package 600 is mounted to the second substrate 702, the device 800 is not limited to such embodiments. For example, in some embodiments, the third substrate 812 is mounted to the package 600 prior to the package 600 being mounted to the second substrate 702. For example, in some embodiments, the substrate 202 is a processor, with the dies 804 being memory dies such as DRAM, signal processing dies, or another die.

Figure 9:
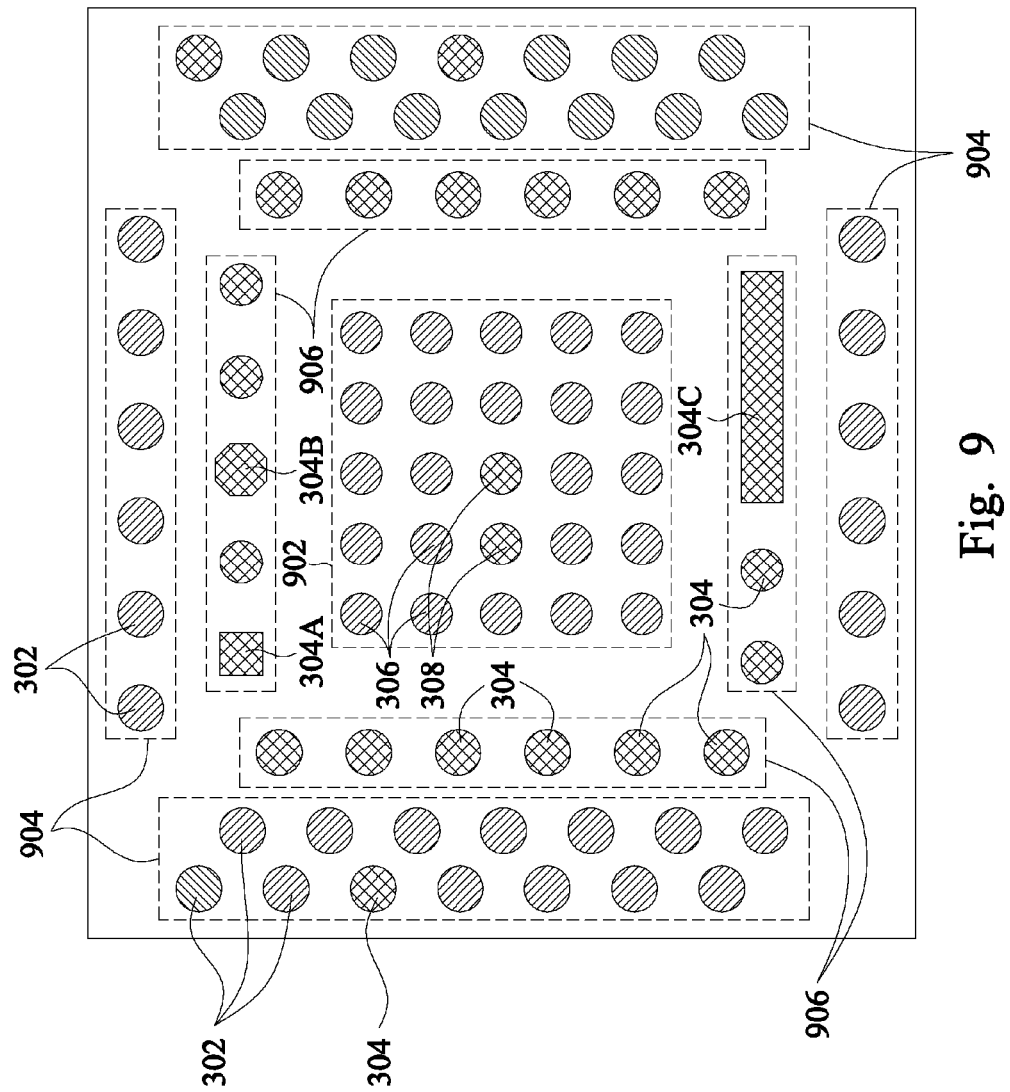
FIG. 9 is a plan view of an arrangement of active vias and dummy vias in accordance with some embodiments.

FIG. 9 is a top view of a molding compound layer 402 with dummy vias 304 arranged with active vias 302 according to some embodiments. In such embodiments, active studs 216 and dummy studs 218 are disposed over the substrate in substrate regions 902. The active studs 216 and dummy studs 218 are arranged in a regular pattern, with the dummy studs 218 disposed in place of missing or omitted active studs 216.

The active vias 302 are disposed in active via regions 904 surrounding the substrate region 902 in an InFO pattern. In some embodiments, dummy vias 304 are disposed in the active via regions 904 with the active vias 302. Additionally, in some embodiments, some of the active via regions 904 are spaced apart from the substrate region 902. Dummy via regions 906 are disposed in the space between the active via regions 904 and the substrate region 902. The dummy via regions 906 have dummy vias 304 arranged in a pattern and disposed between the active via regions 904 and the substrate region 902. The dummy vias 304 in the dummy via region 906 raise the metal density in the spaces between the active via regions 904 and the substrate region 902, preventing dishing or overgrinding of the molding compound layer 402 in the spaces between the substrate and active vias 302. Additionally, the dummy vias 304 in the dummy via regions 906 are spaced apart from the vias 302 and 304 in the active via regions 904 based on the pitch or spacing of the active vias 302. It should be noted that the spacing between the dummy vias in the dummy via region 906 is, in some embodiments, different from the pitch of the active vias 302 or studs 216 and 218. It has been determined that a spacing of the dummy vias 304 in the dummy via region 906 from the vias 302 and 304 in the active via regions 904 of about 50% to about 150% of the active via pitch provides a density and pattern regularity resulting in a substantially planar molding compound layer 402 surface. For example, if the pitch of the active vias 302 is about 200 µm, then the dummy vias 304 in the dummy via regions 906 would be spaced apart from the active vias 302 by between 100 µm and about 300 µm. Additionally, the dummy vias 304 in the dummy via region 906 are spaced apart from the edge of the substrate by between about 50 µm and about 100 µm. The studs 216 and 218 are spaced apart from the substrate edge by about 50 µm, resulting in a spacing between the dummy vias 304 in the dummy via region 906 and the studs that is between about 100 µm and about 150 µm.

While the active vias 302 and dummy vias 302 are generally shown as being round, it should be understood that the dummy vias 304 are, in some embodiments, a different shape than the active vias 302. For example, the dummy vias 304 may have a square shape, as shown by square dummy via 304A, a polygon shape, as shown by octagon dummy via 304B, a rectangle shape, as shown by rectangle dummy via 304C, or any other shape. Additionally, the dummy vias 304 have, in some embodiments, a larger or smaller cross section than the active vias 302. For example, rectangle dummy via 304C has a cross-sectional area that is larger than an active via 302, and extends past multiple active vias 302. The larger or smaller cross-section area can be used to tune the metal density for a particular region to provide more grinding resistance during the reduction of the molding compound layer 402. Similarly, in some embodiments, the active studs 216 and dummy studs 218 have different shapes, with the dummy studs 218 being formed from a polygon, square, rectangle round or other shape.

Figure 10A:
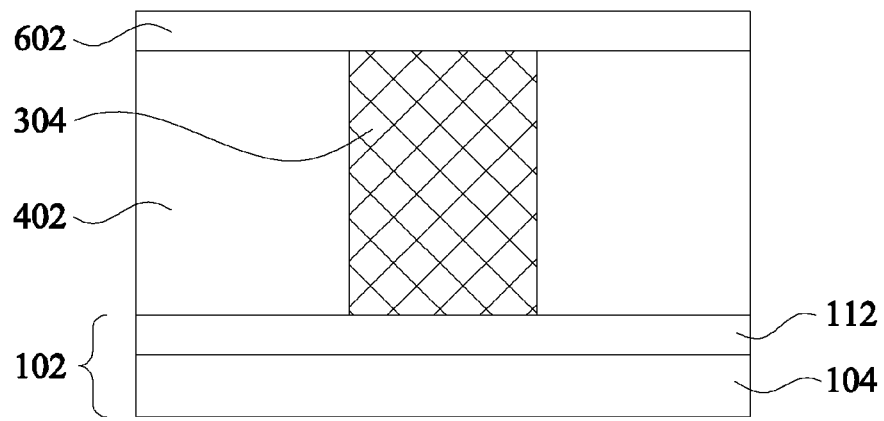
FIGS. 10A through 10C are various embodiments of dummy vias.
Figure 10B:
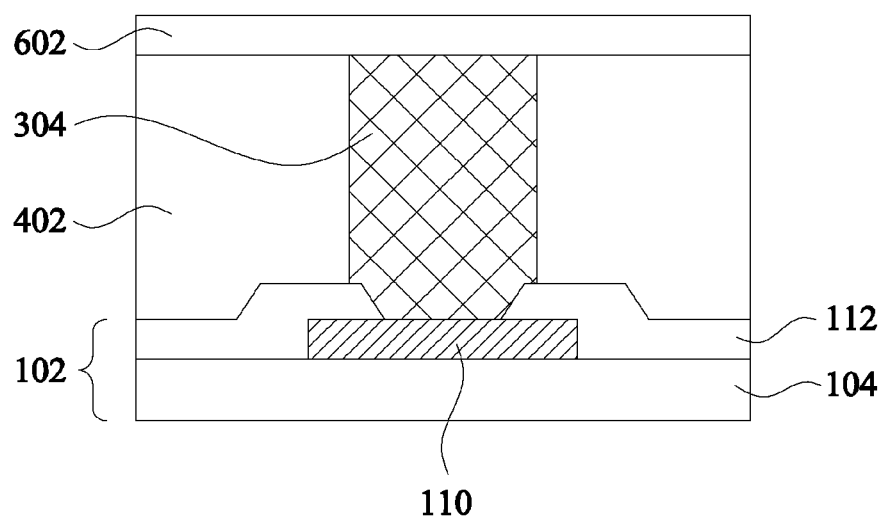
Figure 10C:
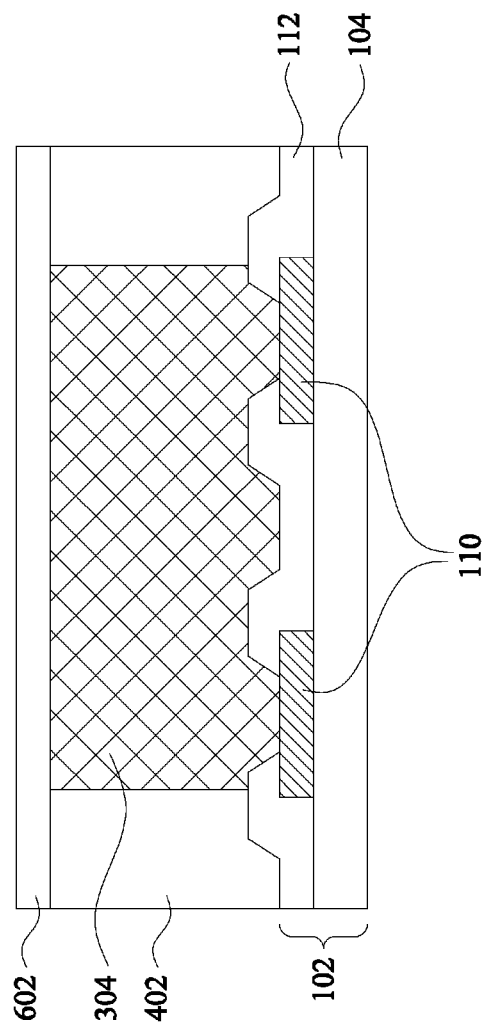

FIGS. 10A through 10C are cross-sectional views illustrating dummy vias 304 formed according to various embodiments. FIG. 10A is a cross-sectional view illustrating a dummy via 304 formed on the protection layer 112 of the first RDL 102 according to some embodiments. In such embodiments, the dummy via 304 has a bottommost surface that is electrically insulated from other conductive structures. In other embodiments, the protection layer has an opening under the dummy via 304, permitting the dummy via to extend through the protection layer 112 and contact an underlying layer, such as a dielectric layer 104. Additionally, in embodiments where the protection layer 112 is absent, the dummy vias 304 is formed on the dielectric layer 104, or another layer over the dielectric layer 104.

FIG. 10B is a cross-sectional view illustrating a dummy via 304 formed on a dummy contact pad 110 according to some embodiments. In such embodiments, the protection layer 112 has an opening exposing the dummy contact pad 110. The dummy via 304 extends through the opening and contacts the dummy contact pad 110. In some embodiments, the dummy contact pad 110 is formed at the same time as the active contact pads (not shown, see FIGS. 1 and 3, element 110A), but is not electrically connected to any of the lands (see FIGS. 1 and 3, element 108). The dummy contact pad 110 has a metal surface that, depending on the method of forming the dummy via 304, provides a level surface with improved metal-to-metal adhesion. Additionally, the dummy contact pad 110 increases the density and regularity of metal features in the first RDL 102.

FIG. 10C is a cross-sectional view illustrating a dummy via 304 formed over multiple dummy contact pads 110 according to some embodiments. As discussed above, the shapes of the dummy vias 304 are tuned to provide a desired metal distribution and density in the molding compound layer 402. In such an embodiment, the dummy via 304 may extend over two or more dummy contact pads 110, extending through multiple openings in the protection layer 112, where provided, and contacting multiple dummy contact pads 110. In such an embodiment, the dummy via 304 extends contiguously over multiple dummy contact pads 110. However, the dummy via 304 is still electrically isolated from the lands 108 and from the active contact pads 110 since the dummy contact pads 110 and the dummy vias 304 are electrically isolated from the other conductive structures. Additionally, while the dummy contact pads 110 are shown as being separated, the embodiments are not limited to such a structure. In other embodiments, one or more dummy contact pads 110 are electrically connected by metal features in the first RDL 102. For example a single dummy contact pad 110 may extend under multiple openings in the protection layer 112, with one or more dummy vias 304 formed thereon. However, in such an embodiment, the dummy vias 304 and dummy contact pads 110 are still electrically isolated from the lands, substrate or active vias.

Figure 11:
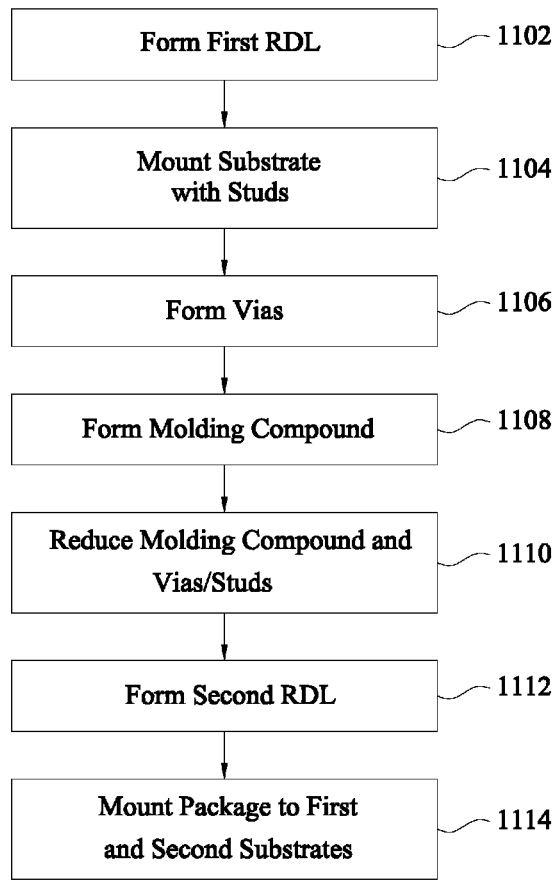
FIG. 11 is a flow diagram illustrating a method for making and using dummy vias according to some embodiments.

FIG. 11 is a flow diagram illustrating a method 1100 of forming and using dummy vias and dummy studs according to some embodiments. Initially, a first RDL is formed in block 1102. A substrate with active and dummy studs, such as a die, package or the like, is mounted on the first RDL in block 1104. Vias, including active and dummy vias are formed on the first RDL in block 1106. Additionally, in embodiments where the studs are not on the substrate when the substrate is mounted, active and dummy studs are formed on the substrate in block 1106. A molding compound layer is formed over the first RDL and around the vias, studs and substrate in block 1108. The molding compound layer is reduced in block 1110 to expose, and in some embodiments, reduce, the top surfaces of the vias and studs. A second RDL is formed on the top surface of the molding compound layer in block 1112. In block 1114, the package is mounted on a substrate, and another substrate is mounted on the package.

Thus, a device according to an embodiment comprises a first RDL having first lands disposed on a bottom surface of the first RDL and active contact pads disposed on a top surface of the first RDL and the first RDL electrically connects the first lands to the active contact pads. A molding compound layer is disposed on the top surface of the first RDL. Active vias extend through the molding compound layer and are in electrical contact with the active contact pads. Dummy vias extending through the molding compound layer. Top surfaces of the active vias and top surfaces of the dummy vias are substantially planar with a top surface of the molding compound layer, and the dummy vias are electrically insulated from the active vias and the first lands.

A device according to another embodiment comprises a first RDL having first lands disposed on a bottom surface of the first RDL. A molding compound layer is disposed on a top surface of the first RDL. Dummy vias extend through the molding compound layer, and the dummy vias are electrically insulated from the first lands. A substrate is disposed in the molding compound layer and dummy studs extend from the top surface of the substrate to a top surface of the molding compound layer. The dummy vias are electrically insulated from the first lands and from contact pads of the substrate. Top surfaces of the dummy vias and top surfaces of the dummy studs are substantially planar with the top surface of the molding compound layer.

A method according to an embodiment comprises forming a first RDL having first lands disposed on a bottom surface of the first RDL and active contact pads disposed on a top surface of the first RDL. The first RDL electrically connects the first lands to the active contact pads. A substrate is mounted on the top surface of the first RDL. Active vias are formed on the top surface of the first RDL and in electrical contact with the active contact pads and dummy vias are formed on the top surface of the first RDL. The active vias and the dummy vias are disposed around the substrate, and the dummy vias are electrically isolated from the active vias and the first lands. A molding compound layer is formed on the top surface of the first RDL and around the active vias, the dummy vias and the substrate. The top surface of the molding layer is reduced, and after the reducing the top surface of the molding compound layer, the top surface of the molding compound layer is substantially planar with top surfaces of the active vias and the dummy vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first redistribution layer (RDL) having first lands disposed on a bottom surface of the first RDL and electrically coupled to active contact pads disposed on a top surface of the first RDL;
    a molding compound layer disposed on the top surface of the first RDL;
    active vias extending through the molding compound layer and in electrical contact with the active contact pads;
    dummy vias extending through the molding compound layer; and
    a second RDL disposed on a top surface of the molding compound layer;
    wherein top surfaces of the active vias and top surfaces of the dummy vias are substantially planar with a top surface of the molding compound layer; and
    wherein the dummy vias are electrically insulated from the active vias and the first lands.

2. The device of claim 1, further comprising:
    a substrate disposed in the molding compound layer; and
    active studs extending from a top surface of the substrate to the top surface of the molding compound layer, wherein the active studs are electrically connected to contact pads on the top surface of the substrate, wherein the active vias and the dummy vias are disposed around the substrate and the active studs.

3. The device of claim 2, further comprising:
    dummy studs extending from the top surface of the substrate to the top surface of the molding compound layer, wherein the dummy studs are electrically insulated from the first lands and from the contact pads of the substrate.

4. The device of claim 1, further comprising:
    a second RDL disposed on the top surface of the molding compound layer, the second RDL having second lands disposed on a top surface of the second RDL, the second RDL electrically connecting the active vias to the second lands, wherein the dummy vias are electrically insulated from the second lands.

5. The device of claim 1, wherein bottommost surfaces of the dummy vias are disposed on the top surface of an electrically insulting portion of the top surface of the first RDL.

6. The device of claim 1, wherein the first RDL has dummy contact pads disposed at a top surface of the first RDL, and wherein the dummy vias are disposed on the dummy contact pads.

7. The device of claim 1, wherein a first one of the dummy vias has a shape different than shapes of other vias of the dummy vias.

8. A device comprising:
    a first redistribution layer (RDL) having first lands disposed on a bottom surface of the first RDL;
    a molding compound layer disposed on a top surface of the first RDL;
    dummy vias extending through the molding compound layer, wherein the dummy vias are electrically insulated from the first lands;
    a substrate disposed in the molding compound layer; and
    dummy studs extending from the top surface of the substrate to a top surface of the molding compound layer, wherein the dummy vias are electrically insulated from the first lands and from contact pads of the substrate; and
    wherein top surfaces of the dummy vias and top surfaces of the dummy studs are substantially planar with the top surface of the molding compound layer.

9. The device of claim 8, further comprising:
active contact pads disposed on the top surface of the first RDL;
active vias extending through the molding compound layer and in electrical contact with the active contact pads;
wherein top surfaces of the active vias are substantially planar with the top surface of the molding compound layer; and
wherein the dummy vias are electrically insulated from the active vias and the active contact pads.

10. The device of claim 9, wherein a first dummy via of the dummy vias has a shape different than shapes of the active vias.

11. The device of claim 10, wherein the first dummy via has a shape that is a square, a rectangle or an octagon.

12. The device of claim 9, further comprising:
a second RDL disposed on the top surface of the molding compound layer, the second RDL having second lands disposed on a top surface of the second RDL, the second RDL electrically connecting the active vias to the second lands, wherein the dummy vias are electrically insulated from the second lands.

13. The device of claim 8, further comprising:
active studs extending from the top surface of the substrate to the top surface of the molding compound layer, wherein the active studs are electrically connected to the contact pads of the substrate.

14. The device of claim 8, wherein the first RDL has a protection layer disposed at the top surface of the RDL, wherein the molding compound layer is disposed on the protection layer, wherein the dummy vias extend above the protection layer.

15. The device of claim 14, wherein bottommost surfaces of the dummy vias are disposed on a top surface of the protection layer.

16. The device of claim 14, wherein the first RDL has dummy contact pads disposed at a top surface of the first RDL, wherein the dummy vias extend through openings in the protection layer and contact the dummy contact pads in the openings.

17. A device comprising:
a die embedded in a first molding compound, the die having a die contact pad on a surface thereof;
an active stud extending through the first molding compound and contacting the die contact pad and a dummy stud extending through the first molding compound and contacting a dielectric layer of the die;
a second molding compound encapsulating the die and the first molding compound;
a first interconnect structure on a first major surface of the second molding compound, the first interconnect structure having a first interconnect structure contact pad;
an active via extending through the second molding compound and contacting the first interconnect structure contact pad and a dummy via extending through the second molding compound and contacting an insulating layer of the first interconnect structure; and
a second interconnect structure on a second major surface of the second molding compound, opposite the first major surface, wherein the active via is in electrical contact with the second interconnect structure on the second major surface and the active stud is in electrical contact with the second interconnect structure at the second major surface and wherein the active via, the dummy via, the active stud and the dummy stud are substantially co-planar at the second major surface.

18. The device of claim 17, wherein the active via has a first shape, viewed in plan view, and the dummy via has a second shape, viewed in plan view, the second shape being different than the first shape.

19. The device of claim 17, wherein the die is mounted to a protection layer formed on the first interconnect structure.

20. The device of claim 17, further comprising a second die electrically connected to the second interconnect structure.

\* \* \* \* \*